United States Patent [19]

Scifres et al.

[11] Patent Number: 4,933,301

[45] Date of Patent: Jun. 12, 1990

[54] METHOD OF FORMING A SEMICONDUCTOR LASER

[75] Inventors: Donald R. Scifres; David Welch, both of San Jose; Peter Cross; William Streifer, both of Palo Alto, all of Calif.

[73] Assignee: Spectra Diode Laboratories, Inc., San Jose, Calif.

[21] Appl. No.: 303,751

[22] Filed: Jan. 27, 1989

[51] Int. Cl.$^5$ .................... H01L 21/20; H01L 21/203
[52] U.S. Cl. ............................ 437/129; 148/DIG. 72; 148/DIG. 84; 148/DIG. 95; 437/22; 437/133; 437/987
[58] Field of Search .................. 148/DIG. 3, DIG. 4, 148/23, 56, 65, 72, 84, 95, 97, 110, 160, 169; 357/16, 17; 372/45, 46, 50; 437/22, 126, 110, 107, 81, 129, 133, 976, 987

[56] References Cited

U.S. PATENT DOCUMENTS

| | | | |
|---|---|---|---|
| 4,255,717 | 3/1981 | Scifres et al. | 331/94.5 H |
| 4,594,718 | 6/1986 | Scifres et al. | 372/45 |
| 4,594,719 | 6/1986 | Ackley | 372/50 |
| 4,639,275 | 1/1987 | Holonyak, Jr. et al. | 437/126 |
| 4,692,925 | 9/1987 | Botez | 372/46 |
| 4,716,125 | 12/1987 | Makiuchi | 437/129 |
| 4,751,194 | 6/1988 | Cibert et al. | 437/126 |
| 4,809,288 | 2/1989 | Welch et al. | 372/45 |
| 4,815,084 | 3/1989 | Scifres et al. | 372/46 |
| 4,843,032 | 6/1989 | Tokuda et al. | 437/129 |
| 4,845,725 | 7/1989 | Welch et al. | 372/46 |
| 4,871,690 | 10/1989 | Holonyak, Jr. et al. | 437/105 |
| 4,875,216 | 10/1989 | Thornton et al. | 372/45 |

FOREIGN PATENT DOCUMENTS

| | | | |
|---|---|---|---|
| 0032481 | 2/1983 | Japan | 437/129 |
| 0015875 | 1/1987 | Japan . | |
| 0282482 | 12/1987 | Japan . | |
| 0255986 | 10/1988 | Japan . | |
| 0146981 | 4/1989 | Japan . | |

OTHER PUBLICATIONS

J. R. Shealy, "High-Efficiency Superlattice Graded-Index Separate Confining Heterostructure Lasers with AlGaAs Single Quantum Wells", Applied Physics Letters, vol. 52, No. 18, May 2, 1988, pp. 1455–1457.

N. Holonyak, Jr. et al., "Quantum-Well Heterostructure Lasers", IEEE Journal of Quantum Electronics, vol. QE-16, No. 2 (Feb., 1980), pp. 170–186.

Yang et al., "Single-Lobed Emission from Phase--Locked Array Lasers", Electronics Letters, vol. 22, No. 1, pp. 2–4, published Jan. 2, 1986.

Wang et al., "In-Phase Locking in Diffraction-Coupled Phased-Array Diode Lasers", Applied Physics Letters, vol. 48, No. 26, pp. 1770–1772, published Jun. 30, 1986.

Primary Examiner—Brian E. Hearn
Assistant Examiner—William Bunch
Attorney, Agent, or Firm—Thomas Schneck

[57] ABSTRACT

A method of making semiconductor laser arrays having an impurity disordered pattern of waveguides at least some of which are directly joined at branching junctions. The region near the branching junctions provides a phase boundary condition in which lightwaves propagating in adjacent waveguides are in phase. Using one impurity dose and one disordering depth in a first portion of the pattern and another in a second portion of the pattern provides a combination of strong and weak waveguiding with strong waveguides that eliminate evanescent coupling from occurring at least in the branching junction regions, and with weak guides near one or both end facets permitting evanescent coupling. The evanescent coupling between adjacent weak waveguides preserves the in phase relationship that was established in the Y-junction regions, resulting in a diffraction limited single lobe far field output. Alternatively, even without evanescent coupling, the modes can adjust their phases in the weak waveguides, where the propagation constant is less tightly specified by the geometry.

24 Claims, 2 Drawing Sheets

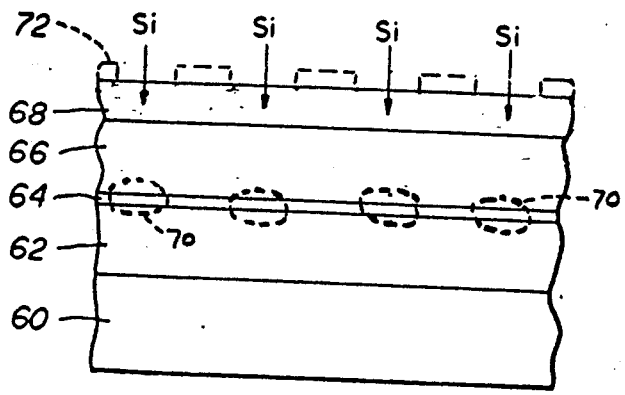
FIG._1
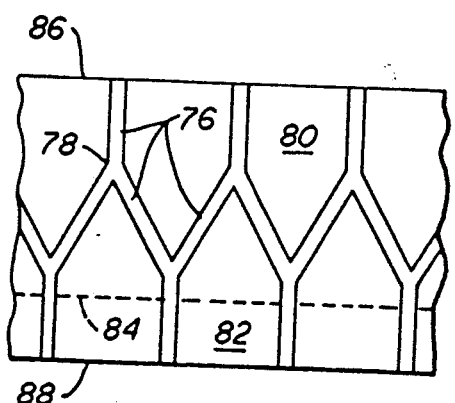
FIG._2
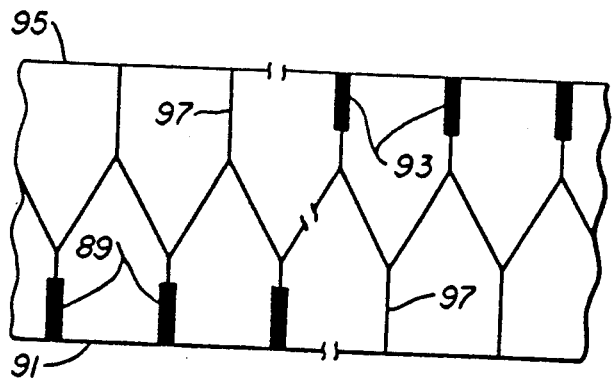
FIG._4
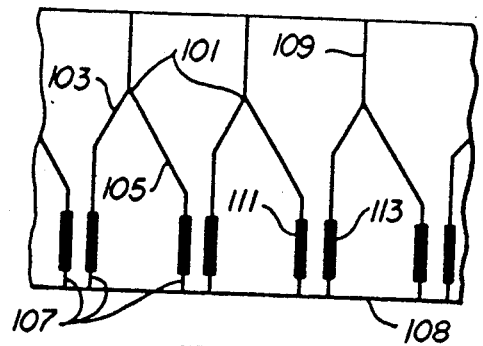
FIG._5
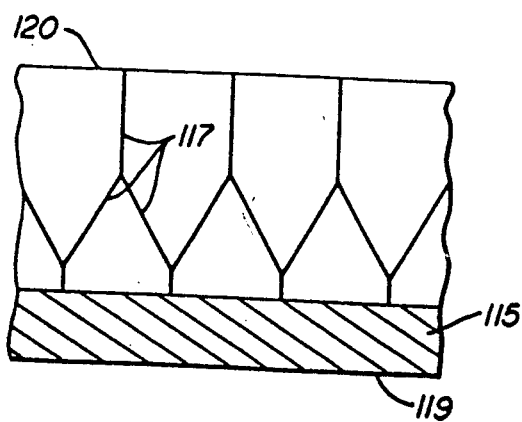
FIG._6
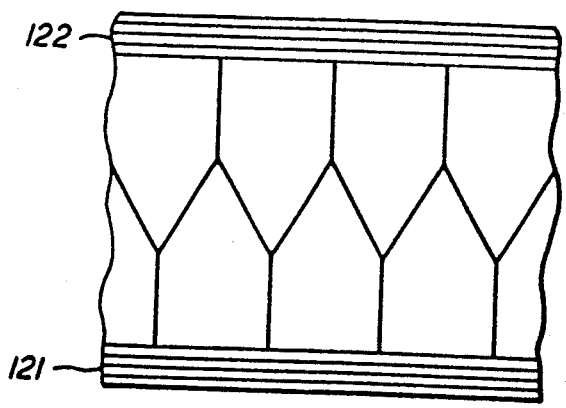
FIG._7

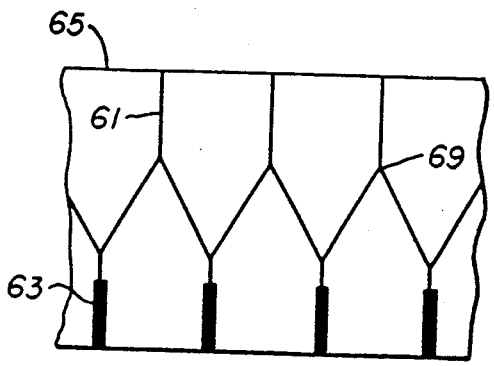
FIG._3A
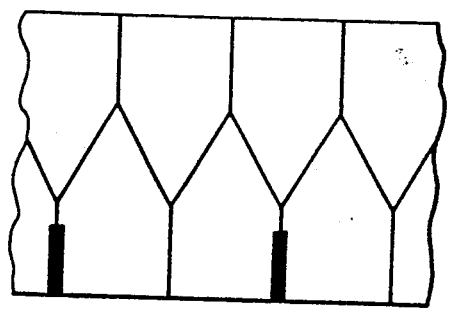
FIG._3B.
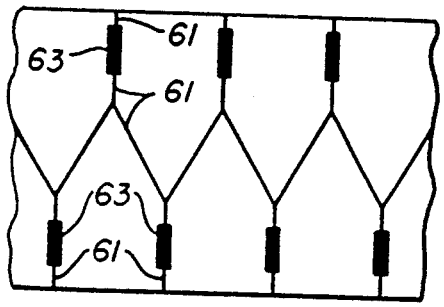
FIG._3C.
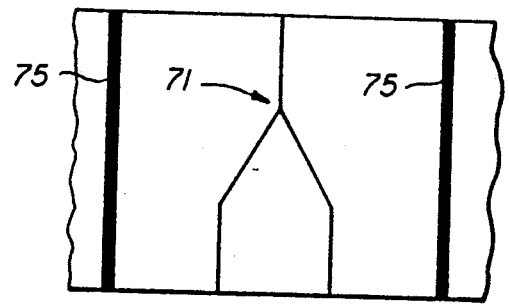
FIG._3D.
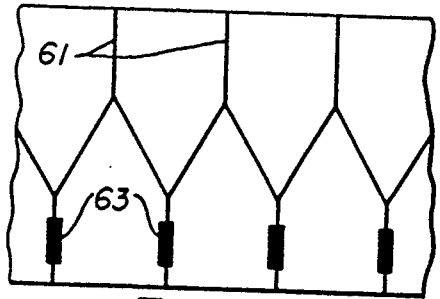
FIG._3E.
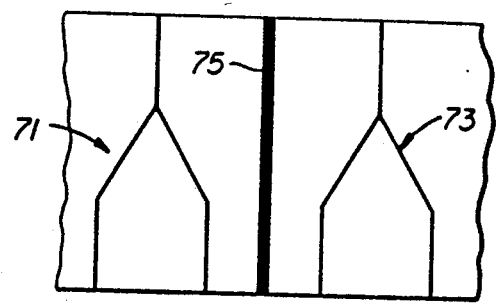
FIG._3F.
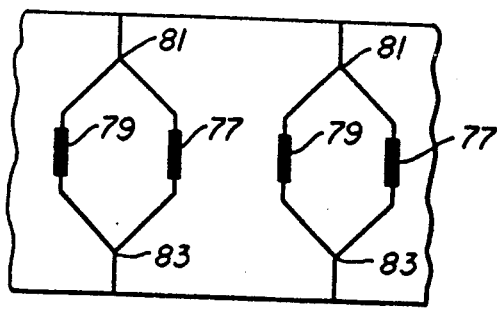
FIG._3G.
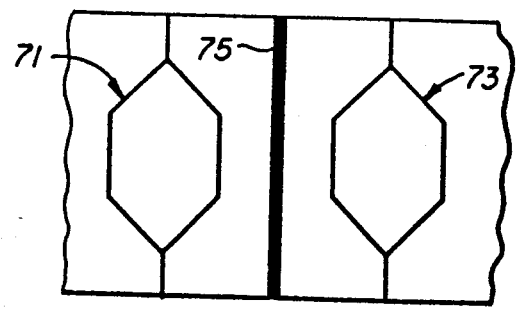
FIG._3H.

METHOD OF FORMING A SEMICONDUCTOR LASER

CROSS REFERENCE TO RELATED APPLICATION

This is a division of application Ser. No. 021,640, filed Mar. 4, 1987, now U.S. Pat. No. 4,809,288.

TECHNICAL FIELD

The present invention relates to methods of making semiconductor lasers and in particular to methods of making lasers with an array of waveguiding structures for diffraction-limited single-lobed far field output.

BACKGROUND ART

In U.S. Pat. No. 4,255,717, Scifres et al. disclose a monolithic laser device in which interconnecting lateral waveguides are provided to deflect and directly couple light propagating in one or more adjacent spatially displaced emitting segments. Waveguiding may be provided for both the emitting segments and the interconnecting lateral waveguides by a refractive index change due to an injected charge distribution determined by current confining channels or contact stripes or due to material thickness or composition change. The interconnecting branching waveguides, termed the "Y-junction region" because of the Y-shaped branching junctions connecting the interconnecting waveguides with the parallel emitting segments, are used to attenuate any out-of-phase components from propagating. The Y-junction region results in boundary conditions on the phase component to be in-phase.

It has been discovered that in order for the Y-junction region to eliminate the out-of-phase modes, the waveguide structure must be strong enough to suppress evanescent coupling in the Y-junction region. The evanescent coupling, or optical wave overlap between adjacent cavities, tends to result in the propagation of out-of-phase mode. Once the light propagates away from the Y-junction region there are no restrictions on the relative phase of the adjacent emitters except at the emitting facet. Slight variations in the processing or growth of the wafer can therefore result in phase errors of the light as it propagates along the waveguides. The far field pattern as a result is broadened due to the phase randomization away from the Y-junction region.

It is an object of the present invention to provide a method of producing semiconductor lasers with waveguides which eliminate this phase randomization and thereby result in a diffraction limited far field pattern.

DISCLOSURE OF THE INVENTION

The above object has been met with a method of forming a semiconductor laser in which phase randomization of light propagating in different paths is eliminated by introducing weaker waveguides along a portion of the optical path. Either by coupling these weaker waveguides along their length or by allowing the guided waves to adjust their own propagation constants, the phase information, controlled by the branching junction regions, is preserved, so that the laser radiates in the in-phase far field mode.

The method comprises forming a substrate and depositing a plurality of semiconductor layers in a heterostructure on the substrate. At least one of the deposited layers forms an active lasing region for lightwave generation. A disorder inducing impurity, such as silicon, is implanted into one or more of the semiconductor layers at some depth from the surface and then annealed at elevated temperatures for a predetermined period of time. Some diffusion away from the implant region may occur. The impurity defines an areawise pattern on the laser, a first portion of which is characterized by one impurity implantation dose or by a first implant depth, while a second portion of the impurity pattern on the laser, laterally or longitudinally spaced from the first portion, is characterized by a different impurity implantation dose or by a second implant depth. The impurity may then form a pattern of spaced-apart waveguides for transmitting lightwaves generated in the active region. The pattern can be such that at least some of the adjacent waveguides are directly coupled together at branching waveguide junctions. Lightwaves propagating in one waveguide combine with lightwaves propagating in an adjacent waveguide in a coupling region defined near the branching junctions and reinforce one another if they are in phase.

The nature of the laser produced by the method is such that portions of the waveguides, including at least the branching Y-junction regions, are strong waveguides characterized by sufficiently strong guiding to fix the modal propagation constants and to eliminate evanescent coupling between adjacent waveguides. Other portions of the waveguides away from the Y-junction regions need not be strong waveguides and may be characterized by weak lightwave guiding so as to allow the modes to select their own propagation constants and/or to cause evanescent coupling between adjacent waveguides. The strong and weak waveguides resulting from the method of the present invention are impurity induced disordering waveguides with different degrees of disordering for the two types of waveguide.

BRIEF DESCRIPTION OF THE DRAWING

FIG. 1 is a side section of a semiconductor laser produced by the method of the present invention and showing the impurity induced disordering steps of the method.

FIG. 2 is a simplified top plan of the semiconductor laser of FIG. 1 illustrating Y-junction waveguides and portions with variable dose implants.

FIGS. 3A–3H and FIGS. 4–7 are schematic top plans of the waveguides for various embodiments of the semiconductor laser in accord with the present invention.

BEST MODE FOR CARRYING OUT THE INVENTION

With reference to FIGS. 1 and 2, the method of the present invention uses an implantation of a disorder inducing impurity of variable dose, variable depth or both, followed by annealment to produce variable degrees of disordering thereby creating both strong and weak index guides in a hybrid laser. A substrate 60 is formed and a plurality of semiconductor layers 62, 64, 66 and 68 are deposited on substrate 60. Semiconductor lasers are preferably fabricated on a wafer substrate by metal-organic chemical vapor deposition, but may also be fabricated by liquid phase epitaxy, molecular beam epitaxy or other known crystal growth processes Typically, the layers form a GaAs/GaAlAs heterostructure. Substrate 60 is typically composed of n-type GaAs. Cladding layer 62 is at least one micron thick and typically composed of n-type $Ga_{0.7}Al_{0.3}As$. Cladding layer 66 is similarly at least one micron thick but composed of p-type $Ga_{0.7}Al_{0.3}As$. Cladding layers 62 and 66 may also comprise a layered structure of barrier and quantum well materials whose effective band gap is higher and whose effective refractive index is lower than the active region 64 Such a structure is described, for example, by J. R. Shealy in *Applied Physics Letters, vol.* 52, no. 18 2 May 1988, pp. 1-455-1457. A cap layer 68 is typically about 0.5 micron thick and composed of p-type GaAs. The compositions and thicknesses may vary by about 5 percent It will, of course, be recognized that the conductivity type of the layers may be reversed from those noted above. Likewise, instead of GaAs and GaAlAs, other light emitting semiconductor materials, such as GaAlSb, InP, InGaAsP, other Group III–V compounds, Group II–VI compounds and Group IV–VI compounds may be used. Moreover, the dimensions, doping levels, compositions and dopants mentioned above are exemplary only.

The layers include an active lasing region 64 sandwiched between cladding layers 62 and 66 for lightwave generation and propagation under lasing conditions. Active lasing region 64 may or may not be intentionally doped and might consist of four 50 to 150 Å thick quantum wells of GaAs alternating with three 30 to 150 Å thick barriers of $Ga_{0.8}Al_{0.2}As$. Such quantum-well structures are known and described in an article by N. Holonyak, Jr. et al. entitled "Quantum-well Heterostructure Lasers" in *IEEE Journal of Quantum Electronics, vol.* QE-16 no. 2 (February 1980), pp. 170-186. Alternatively, instead of a plurality of thin layers in a quantum-well or multiple-quantum-well heterostructure, active region 64 may be formed from a single layer of $Ga_{1-w}Al_wAs$ where w is typically less than 0.1 μm. This layer may comprise the active region for a separate confinement heterostructure perhaps with graded index cladding layers. As noted above, the cladding layer may also comprise multiple layers of barrier and quantum well material. In any case, layer 64, with the highest effective index of refraction and lowest band gap, forms the active lasing region for lightwave generation and propagation under lasing conditions.

Next the wafer is removed from the growth chamber and a waveguide pattern, such as those seen in FIGS. 3A-H is developed lithographically in a photoresist layer deposited over the cap layer. After pattern definition, a disorder inducing impurity, such as silicon, is implanted into one or more semiconductor layers 62, 64, 66, forming implants 70, laterally spaced apart as shown in phantom. For example, silicon may be implanted at an energy of about 80 kev, through a mask 72, shown in phantom, of $Si_3N_4$. After implantation, the impurity is annealed to activate the implants 70. Such annealing may be produced by heating the implanted semiconductor wafer at elevated temperatures for a predetermined period of time. Some diffusion may occur, broadening the implanted volume. The impurity defines a waveguide pattern, seen in FIG. 2, having a plurality of spaced apart waveguide elements 76, at least some of which are directly connected together at Y-shaped junctions 78.

By varying the implantation dose, the index of refraction of portions of the heterostructure can be varied. For example, in FIG. 2, a first portion 80 of the waveguide pattern on one side of dashed line 84 may be characterized by a first implantation dose, while a second portion 82 of the waveguide pattern on the opposite side of dashed line 84 may be characterized by a second implantation dose. Typically, the implantation dose in regions 80 is about $1 \times 10^{16}$ silicon atoms per cubic centimeter and the implantation dose in regions 82 is about $1 \times 10^{15}$ silicon atoms per cubic centimeter. A difference in the implantation dose produces a difference in the degree of disordering upon annealing, and results in a difference in the index of refraction. Accordingly, the implanted impurity, i.e. silicon, causes a first degree of disordering in regions 80, and a second degree of disordering in regions 82. The active region 64, which has an effective refractive index of about 3.55 is reduced by this method by a controllable amount in the range from 0.00 to 0.05. The laser array structure shown in FIGS. 1 and 2 have both strong and weak index guiding portions. Portions of waveguides 76 in regions 80 are strongly guided due to the greater disordering from the higher implantation dose. Portions of waveguides 76 in regions 82 are weakly guided due to a lesser disordering from the lower implantation dose. Thus, a hybrid laser array is created.

The depth of disordering, which is controllable through the implantation dose, the accelerating voltage or both, is used to create index changes in various layers at different depths across the wafer. For example, in one experiment silicon was implanted at an energy of 80 kev and annealed for one hour at 850° C. The disordering depths for implantation doses of $7 \times 10^{14}\,cm^{-3}$, $3 \times 10^{15}\,cm^{-3}$ and $1 \times 10^{16}\,cm^{-3}$ were 0.35 μm, 0.75 μm and 0.9 μm respectively. For an annealing time of two hours, the disordering depths were 0.75 μm, 0.85 μm and 1.2 μm respectively.

Conductive contact layers, not shown, are deposited lastly on substrate 60 and cap layer 68 and provide a metallization for electrode connection for forward biasing of the laser and current injection whereby light is generated in active region 64. The contact layer on substrate 60 is typically composed of Au/Ge alloy while the contact layer on cap layer 68 is typically composed of a Ti/Pt/Au alloy.

With reference to FIG. 2, the resulting semiconductor laser has an array of generally parallel spatially displaced waveguides 76 for guiding lightwaves propagating in an active region under lasing conditions in a resonant optical cavity defined between an end facet 86 and an end facet 88. Waveguides 76 form laser light emitters at one or both of the facets 86 and 88 from where a plurality of beam elements are radiated. The number of emitters may range from a few to several thousand or more and the beam elements are preferably radiated in phase with one another so as to form a diffraction limited single lobe far field pattern.

Adjacent waveguides are directly connected together by interconnecting waveguides at Y-shaped junctions 78. In operation, lightwaves from adjacent waveguides propagating in interconnecting waveguides interact in junction regions defined near Y-shaped junctions 78. If light from adjacent waveguides are in phase with one another, they reinforce one another in Y-junction region, and the resulting superposed lightwave continues to propagate. But if light from adjacent waveguides are out of phase from one another, the resulting superposed lightwave is attenuated. Waveguides 76 preferably support a single mode in order to enhance the attenuation of out of phase modes. The Y-junctions 78 result in boundary conditions causing the phase component of propagating lightwaves to be in phase.

In the laser in FIG. 2, a dashed line 84 demarcates regions of the laser which contain waveguides that are either strongly or weakly guiding. Region 80 from dashed line 84 to rear end facet 86 contains waveguides 76 characterized by strong waveguiding properties, while region 82 between dashed line 84 and front end facet 88 contains waveguides characterized by weak waveguiding properties. A strong index guide is defined as one that eliminates evanescent coupling between waveguides to an extent that the waveguides would remain incoherent in an array unless other types of coupling, such as Y-junctions 78, are introduced. A weak index guide is defined as one in which the waveguides are either normally evanescently coupled to such extent that they would emit coherently if no other coupling mechanism were present, or the waveguides are such that the modal propagation constant is not tightly fixed, i.e. the propagation constant varies through evanescently coupled regions more than in strong index guide regions. As a result of strong waveguiding in regions 80, lightwaves propagating in adjacent waveguides 76 have narrow widths, much smaller than the separation between the adjacent waveguides, so that evanescent coupling, i.e. optical wave overlapping, is substantially eliminated. On the other hand, lightwaves propagating in adjacent waveguides of weak guiding region 82 have broad widths on the order of the waveguide separation, so that wave overlapping, i.e. evanescent coupling, may occur.

In order for Y-junction regions 78 to eliminate out-of-phase modes, the waveguiding must be strong enough to eliminate evanescent coupling. Evanescent coupling tends to result in the propagation of out-of-phase modes, because the out-of-phase modes have a zero electric field amplitude between the waveguides which coincides with the zero, lower gain or higher loss regions between adjacent waveguides. Accordingly, strong guiding region 80 includes at the very least junction regions around Y-shaped junctions 78. Regions of the laser away from Y-junction 78 need not eliminate evanescent coupling and may have either strong or weak waveguides.

Once lightwaves propagate away from the junction regions, there are no restrictions on the relative phase of the adjacent emitters except at the facets 86 and 88. Without coupling between the adjacent waveguides, or permitting the phase to self-adjust, slight variations in the processing of the laser can result in phase randomization of the light waves as they propagate along the waveguides. Weakly guided regions 82 are thus provided to preserve the phase information derived from the Y-junction regions by allowing evanescent coupling or phase adjustment of the lightwaves.

With reference to FIGS. 3A-3H, various possible waveguide patterns may be used to produce a single lobed far field beam output. The pattern in FIG. 3A corresponds to the laser of FIG. 2. Strong waveguides are represented by thin lines 61, while weak waveguides are represented by thick lines 63. Laser light output may be from either the rear facet represented by top horizontal line 65, the front facet represented by bottom horizontal line 67, or both. In all of the patterns, at least some of the adjacent waveguides are directly coupled together in Y-junction regions defined near Y-shaped junctions 69. In FIGS. 3A, 3B, 3C and 3E, all of the waveguides are directly joined, while in FIGS. 3D, 3F, 3G and 3H, only some of the waveguides are directly joined, the waveguides being organized into groups 71 and 73 of directly coupled waveguides, adjacent groups being evanescently coupled together by weak waveguides 75 therebetween or by weak waveguide portions 77 and 79 in center portions of the waveguides defined between Y-shaped junctions 81 and 83. Weak waveguide portions 63 may be located near both end facets, as in FIG. 3C, or near one end facet, as in FIGS. 3A, 3B and 3E. The waveguides may also alternate between strong and weak guiding, as shown in FIG. 3B. The weak waveguide portions may extend to the end facets, as in FIG. 3A, or may stop short of the end facets, as in FIGS. 3C and 3E. If the waveguides at the emitting facet 65 or 67 are strong waveguides, the guides may be flared, the width may increase toward the emitting facet, to produce a greater laser beam spot size and thereby reduce the beam divergence of the emitters, increase the "fill factor" of the radiators, and reduce the potential for facet damage at high energy laser output.

With reference to FIG. 4, weakly guided laser arrays of the prior art tend to undergo lateral superradiance when the number of waveguides, array width or waveguide packing density exceeds a certain limit. Lateral superradiance is a condition in which stimulated emission and light amplification occurs for lightwaves propagating in the lateral direction. Lateral superradiance consumes power that could be used for producing light emission in the longitudinal direction and also produces additional waste heat. To overcome this, the waveguide pattern in FIG. 4 has weak guides 89 near a front facet 91 for a portion of the laser array width, then switches to have weak guides 93 near a rear facet 95. Lateral superradiance is prevented because any laterally propagating light across weak guides 89 or 93 encounters strong guides 97 that attenuate the laterally propagating lightwaves before a lasing threshold is reached. If lateral superradiance is not eliminated, or greatly reduced, too many injected charges are lost to the superradiance. Typically, the switch of weak waveguides from front to rear facet, and vice versa, occurs every few hundred micrometers.

In FIG. 5, a waveguide pattern has asymmetric Y-junctions 101. By "asymmetric" we mean that the waveguide branches 103 and 105 from a Y-junction 101 have different lengths. This produces waveguides 107 with non-uniform spacing at a light emitting facet 108. Portions 109 of the waveguides, including Y-junctions 101, are characterized by strong waveguiding, while other portions 111 and 113 are characterized by weak waveguiding. The non-uniform waveguide spacing tends to produce a diffraction-limited single lobed far field profile when each of waveguide elements emits light in phase. In FIG. 6 a gain guided broad area section 115 with no lateral waveguide is coupled to the end of the Y-junction array 117. This section allows either evanescent coupling of filaments which form or adjustment of propagation constant between the mirror 119 and the strong waveguides 117.

In FIG. 7, the mirrors 119 and 120 of FIG. 6 have been replaced with distributed feedback (DFB) gratings 121 and 122. Such gratings provide optical feedback and can also diffract light out of the surface of the laser if the grating period is second order or greater. The grating areas 121 and 122 are weakly guided broad area gain guided sections.

The semiconductor lasers produced by the present invention provide a combination of weak and strong waveguides that eliminate or reduce phase randomization away from the Y-junction regions. The resulting arrays emit light characterized by a diffraction limited single lobe far field profile

We claim:

1. A method of forming a semiconductor laser comprising
   (a) depositing on a substrate a plurality of semiconductor layers, said layers including at least one active lasing region for lightwave generation,
   (b) implanting a disorder inducing impurity into one or more of said semiconductor layers, said impurity defining a pattern, a first portion of said pattern characterized by a first implantation dose of said impurity and a second portion of said pattern characterized by a second implantation dose of said impurity, and
   (c) annealing said impurity in said semiconductor layers, said impurity producing a first degree of disordering in said first portion of said laser and a second degree of disordering in said second portion of said laser.

2. The method of claim 1 wherein said active lasing region is disordered in said first portion of said laser array more than in said second portion.

3. The method of claim 1 wherein said annealing of said impurity is produced by heating at elevated temperatures for a predetermined period of time.

4. The method of claim 1 wherein said disorder inducing impurity is silicon.

5. The method of claim 1 wherein said impurity defines a pattern of spaced apart waveguides for transmitting lightwaves generated in said active lasing region, at least some of said waveguides being directly connected together at branching waveguides junctions, said first portion of said pattern including said junctions.

6. The method of claim 5 wherein said spaced apart waveguides are nonuniformly spaced, said branching waveguide junctions being asymmetric.

7. The method of claim 5 wherein said second portion of said waveguide pattern is located near one end of said waveguides.

8. The method of claim 5 wherein second portions of said waveguide pattern are located near both ends of said waveguides.

9. The method of claim 5 wherein said second portion of said waveguide pattern extends to the ends of said waveguides.

10. The method of claim 5 wherein first portions of said waveguide pattern are located near both ends of said waveguides and at said branching waveguide junctions and said second portion of said waveguide pattern is located in a central region between said branching waveguide junctions.

11. The method of claim 5 wherein said pattern of spaced apart waveguides are arranged into groups of directly coupled waveguides, said second portion of said pattern defining weak waveguides between said groups.

12. The method of claim 5 wherein second portions of said pattern are located near one end of said waveguides for a first set of waveguides and near the other end of the waveguides for a second set of waveguides.

13. A method of forming a semiconductor laser comprising,
   (a) depositing on a substrate a plurality of semiconductor layers, said layers including at least one active lasing region for lightwave generation,
   (b) implanting a disorder inducing impurity to a first depth within said semiconductor layers, said impurity defining a first portion a pattern,
   (c) implanting a disorder inducing impurity to a second depth within said semiconductor layers, said impurity at said second depth defining a second portion of said pattern, and
   (d) annealing said impurity in said semiconductor layers, said impurity disordering said layers at a first disordering depth in said first portion of said laser array and at a second disordering depth in said second portion of said laser.

14. The method of claim 13 wherein said active lasing region is disordered in said first portion of said laser array more than in said second portion.

15. The method of claim 13 wherein said diffusing of said impurity is produced by annealing at elevated temperatures for a predetermined period of time.

16. The method of claim 13 wherein said disorder inducing impurity is silicon.

17. The method of claim 13 wherein said impurity defines a pattern of spaced apart waveguides for transmitting lightwaves generated in said active lasing region, at least some of said waveguides being directly connected together at branching waveguides junctions, said first portion of said pattern including said junctions.

18. The method of claim 17 wherein said spaced apart waveguides are nonuniformly spaced, said branching waveguide junctions being asymmetric.

19. The method of claim 17 wherein said second portion of said waveguide pattern is located near one end of said waveguides.

20. The method of claim 17 wherein second portions of said waveguide pattern are located near both ends of said waveguides.

21. The method of claim 17 wherein said second portion of said waveguide pattern extends to the ends of said waveguides.

22. The method of claim 17 wherein first portions of said waveguide pattern are located near both ends of said waveguides and at said branching waveguide junctions and said second portion of said waveguide pattern is located in a central region between said branching waveguide junctions.

23. The method of claim 17 wherein said pattern of spaced apart waveguides are arranged into groups of directly coupled waveguides, said second portion of said pattern defining weak waveguides between said groups.

24. The method of claim 17 wherein second portions of said pattern are located near one end of said waveguides for a first set of waveguides and near the other end of the waveguides for a second set of waveguides.

* * * * *